US006178210B1

(12) United States Patent
Craig et al.

(10) Patent No.: US 6,178,210 B1
(45) Date of Patent: Jan. 23, 2001

(54) METHOD AND APPARATUS FOR REDUCING DATA DISTORTION AND IMPROVING SIMULCAST RECEPTION

(75) Inventors: Ronald A. Craig, Boynton Beach; Clinton C. Powell, II, Lake Worth; Dalier J. Ramirez, Boca Raton, all of FL (US); Stephen R. Carsello, Ft. Worth, TX (US)

(73) Assignee: Motorola, Schaumburg, IL (US)

( * ) Notice: Under 35 U.S.C. 154(b), the term of this patent shall be extended for 0 days.

(21) Appl. No.: 09/035,797

(22) Filed: Mar. 6, 1998

(51) Int. Cl.[7] .............................. H03K 5/08; H04L 25/49

(52) U.S. Cl. .......................... 375/346; 375/293; 455/503; 455/303

(58) Field of Search .................................... 375/293, 346; 455/303, 503

(56) References Cited

U.S. PATENT DOCUMENTS

| | | | | |
|---|---|---|---|---|
| 4,363,129 | * | 12/1982 | Cohn et al. | 455/17 |
| 4,570,265 | * | 2/1986 | Thro | 455/503 |
| 5,602,877 | * | 2/1997 | Boccuzzi et al. | 375/336 |
| 5,673,197 | * | 9/1997 | Keba et al. | 702/179 |
| 5,692,019 | * | 11/1997 | Chang et al. | 375/347 |
| 6,055,436 | * | 4/2000 | Powell, II et al. | 455/503 |
| 6,078,801 | * | 6/2000 | Souissi | 455/303 |
| 6,084,931 | * | 7/2000 | Powell, II et al. | 375/355 |

OTHER PUBLICATIONS

Virginia Tech Symposium 1991, vol. 16, entitled "Transmitter Timing Optimization in Digital Simulcast Networks" by Rade Petrovic, Center for Wireless Communications, Univeristy of Mississippi, pp. 167–176.

* cited by examiner

*Primary Examiner*—Stephen Chin
*Assistant Examiner*—Paul N. Rupert
(74) *Attorney, Agent, or Firm*—Pablo Meles

(57) ABSTRACT

A selective call receiver unit (700) capable of reducing data distortion and improving simulcast reception includes a selective call receiver (20), a demodulator (30) coupled to the selective call receiver and a circuit (36 and 300) coupled to the demodulator for reducing data distortion received at a selective call receiver. The circuit includes a detector (350) for detecting a simulcast signal, a filter (351) for windowing the symbol edge area in the simulcast signal providing a windowed symbol edge area, and a clipping circuit (36) for clipping the windowed symbol edge area.

22 Claims, 7 Drawing Sheets

200

METHOD AND APPARATUS FOR REDUCING DATA DISTORTION AND IMPROVING SIMULCAST RECEPTION

FIELD OF THE INVENTION

The present invention is directed to a communication device, such as a selective call receiver, and more particularly to a communication device and method capable of detecting simulcast conditions and limiting distortion caused by Simulcast Delay Spread distortion.

BACKGROUND OF THE INVENTION

When designing a communications system, it is often desired to cover an area larger than can be economically covered by a single transmitter site. In such cases, multiple transmitter sites are employed, each transmitting substantially the same data on substantially the same channel, in a process known as simulcasting. Due to differences in propagation delays and other factors, a receiver in the coverage area may receive signals from two or more transmitters at slightly different times, leading to a form of distortion known as Simulcast Delay Spread (SDS) distortion. Under certain conditions this distortion may become severe and corrupt the received data to an unacceptable degree.

Receiver modifications to reduce the effects of SDS distortion are known in the art; however, these modifications tend to degrade static (i.e., non-simulcast) sensitivity, adjacent channel selectivity (or rejection), or other desirable receiver performance parameters. Conversely, methods of optimizing the receiver to achieve maximum static sensitivity tend to degrade the receiver's performance in the presence of SDS distortion.

Since it is difficult to simultaneously optimize a receiver for best SDS distortion and static sensitivity performance, a need exists not only for a method at a receiver which can reliably discern between a signal subject to SDS and a signal that is not, but for a method or an apparatus that simply reduces the effects of SDS distortion once a simulcast signal is known to exist. If this were available, an adaptable receiver optimized for static sensitivity could be used that employed SDS distortion mitigation methods only when in a simulcast environment, and therefore achieve optimum performance in both static and simulcast environments.

DESCRIPTION OF A PREFERRED EMBODIMENT

Figure 1:
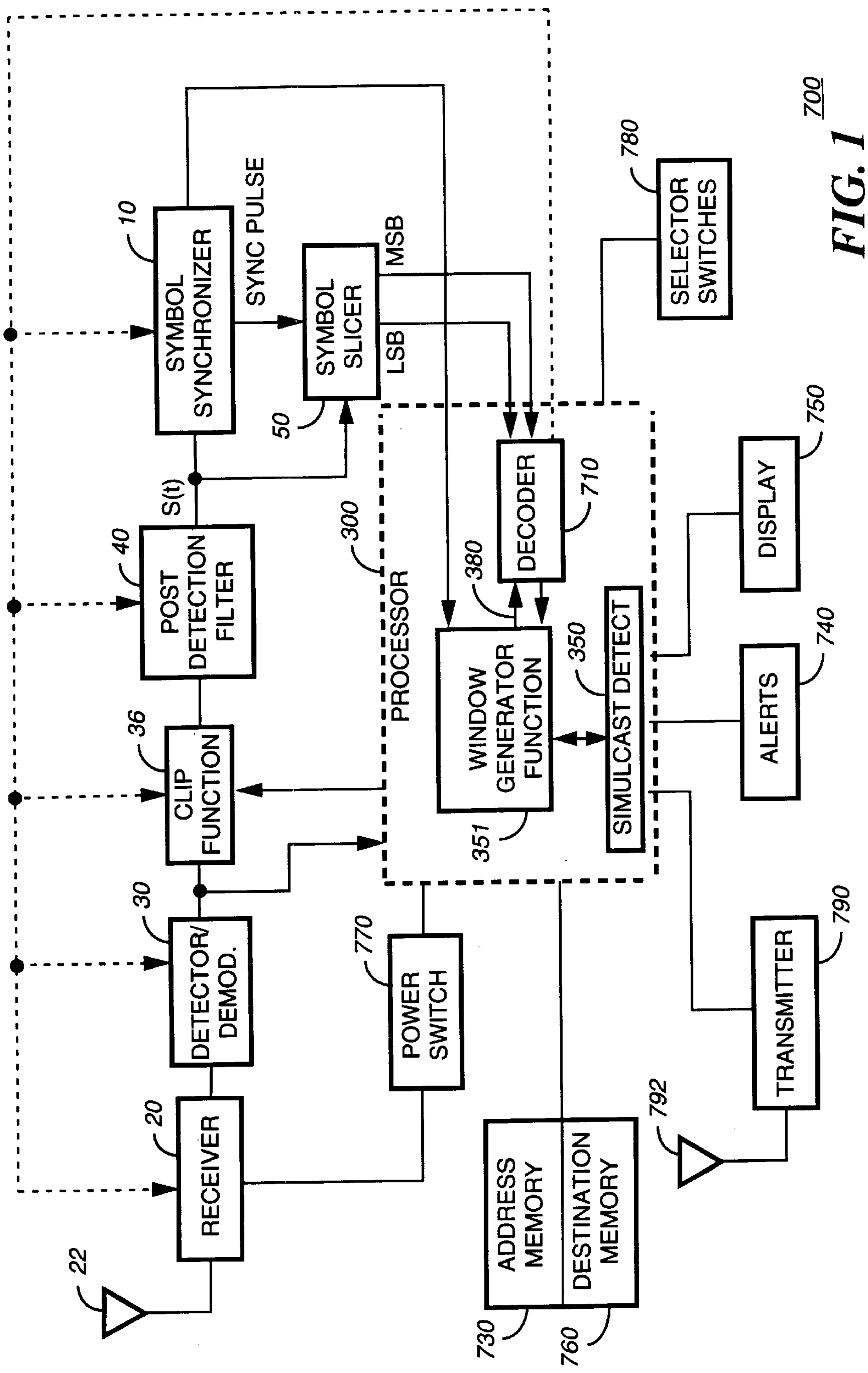
FIG. 1 is a block diagram of a selective call receiver including a clipping circuit in accordance with the present invention.

FIG. 1 illustrates a selective call receiver (such as a pager) 700 utilizing a circuit for reducing data distortion that preferably comprises a clipping function or circuit 36, a window generator function or circuit 351, and a simulcast detection circuit 350 according to the present invention. The window generator function or circuit 351 and the simulcast detection circuit 350 maybe part of a processor 300 that controls many of the functions required in a selective call receiver. It should be understood that the window generating and simulcast control functions could be achieved through the use of a stand-alone window generator function 351 and simulcast detection circuit 350 without the use of the processor 300. In particular, the simulcast detection circuit 350 issues a simulcast detection signal 380 when a simulcast signal is detected to allow for appropriate filtering and other functions for optimum performance under various conditions. The simulcast detection circuit 350 may also be embodied by (among other devices) a digitally adjustable detector (DAD) for example. The appropriate filtering and functions for optimum performance preferably includes the function of identifying symbol edge areas and symbol center areas and windowing the symbol edge areas. Once the symbol edge areas are identified, this windowed symbol edge area can be clipped to reduce data distortion. Alternatively, the symbol edge area and/or the symbol center area can be windowed and subsequently clipped. Additionally, the window width will preferably be based on an expected simulcast delay up to a predetermined fraction of a symbol time. As will be seen in further refinements, the step of clipping can be adjusted based on an estimate of the DC offset observed at the output of the detecting step and the gain of the PDF if necessary.

From a simulcast performance standpoint, the benefit of clipping a symbol edge area versus clipping both the symbol edge area and the symbol center area depends on the protocol being used. Further, in some instances, clipping just the symbol center area may provide some improved performance over not clipping at all. With the ReFLEX® protocol where no issue exists with phase imbalances, clipping both a windowed symbol edge area and a windowed symbol center area would provide better performance in simulcast while not degrading the sensitivity imbalance between the phases (since there are no phases) than just clipping the windowed symbol center area. With the FLEX™ protocol, clipping just the windowed symbol edge area would provide better performance in simulcast while slightly degrading the sensitivity imbalance between the phases while clipping both the windowed symbol edge area and windowed symbol center area in the FLEX™ protocol would cause better simulcast performance, but seriously degrade the sensitivity imbalance between the phases. The importance of windowing and clipping the symbol edge area becomes evident in a pager that decodes FLEX™ (where the phases are interleaved) to the point where one pager incorporating the present invention will decode a message and a similar FLEX™ pager without the clipping feature will not decode the same message due to the data distortion. Thus, windowing a simulcast signal for a fraction of a symbol time to provide a windowed symbol area and then clipping the windowed symbol area will generally provide better simulcast performance in a selective call receiver than not clipping at all.

The selective call receiver 700 comprises a receiver 20 for receiving RF signals detected by antenna 22. The received signal output by the receiver 20 is connected to the detector or demodulator 30. The demodulator 30 outputs the demodulated signal to a processor 300 and a clipping function 36 which outputs a clipped signal to a post detection filter (PDF) 40, which ultimately outputs a filtered demodulated signal S(t) to a symbol synchronizer 10 and symbol slicer 50. The post detection filter 40 can also be embodied by a finite impulse response detector filter. The demodulator 30 provides an output signal to the processor 300 to assist in detecting the presence of a simulcast signal via the simulcast detection circuit 350 and to further assist in determining an appropriate window for the symbol edge area (for subsequent clipping by the clip function 36). The symbol synchronizer 10 issues sync pulses to control when a symbol slicer 50 samples the filtered demodulated signal S(t) in order to compare the level of the demodulated signal (which may be digital or analog) with predetermined thresholds to output corresponding digital data, such as 2 level data ("0" or "1"), 4 level data ("00", "01", "11" or "10"), or in general m-level data. The symbol synchronizer 10 is also coupled to the simulcast detector 350. The symbol synchronizer 10 preferably examines the slope of the demodulated signal S(t) for transitions between various levels such as shown in the method and apparatus described in a U.S. patent application 6,084,931 having docket number PT02636U by Powell et al., entitled Symbol Synchronizer Based on Eye Pattern Characteristics Having Variable Adaption Rate and Adjustable Jitter Control and Method Therefor, which is assigned to the assignee of the present invention and hereby incorporated by reference. However, it should be appreciated by those with ordinary skill in the art that the techniques and circuitry is applicable to any m-level FM signal and that other techniques may be used with the present invention.

The processor 300 is a controller which may include a decoder 710 or decoder function that is preferably coupled to the symbol slicer 50 and decodes the digital data in accordance with protocol rules established for example, by Motcrola's FLEX™ paging protocol. For example, the decoder outputs corresponding address information, message information and/or control information. The processor 300 is preferably either coupled to or incorporates the decoder 710 and is the control point for the selective call receiver 700. Among other things, the processor 300 may control the receiver 20, demodulator 30, clip function 36, post detection filter 40 and symbol synchronizer 10. The processor 300 compares received address information with predetermined addresses stored in the address memory 730 in order to trigger one of the alerts 740 or to display a received text or graphics message on display 750. In addition, messages are stored in a destination memory 760. The processor 300 also is connected to a power switch 770 to shut down the receiver 20 and other components of the selective call receiver during periods of time when the particular selective call receiver is not expected to receive information. A user interface to the selective call receiver 700 is achieved through selector switches 780. The selective call receiver may also have acknowledge-back or reverse channel transmitting capability, and accordingly may comprise a transmitter 790 and a transmitting antenna 792.

The series of equations and algorithms used in the processor 300 above can be implemented in many ways, such as by hardware circuits, a digital signal processor, computer software, microprocessor instructions, etc. Those ordinarily skilled in the art will appreciate that other methods, in addition to those mentioned, are equally suitable. All of the circuits shown as part of the clip function 36, the window generator function 351, the simulcast detector 350 or the processor 300 can be integrated onto a single application specific integrated circuit (ASIC), together with other signal processing functionalities.

Generally, from typical eye diagrams examined, SDS distortion is localized to the symbol transitions and does not occur at or near the center of the symbol when looking at the output of the detector (PDF input). On the other hand, Static noise or Gaussian noise is generally evenly distributed along the entire symbol time including both the symbol center and symbol transition (or edge) areas. Thus, from these characteristics, measurements of excursions from predetermined thresholds at or above symbol centers or symbol edges (or transitions) provides adequate confirmation of the presence (or non-existence) of a simulcast channel signal as disclosed and discussed in U.S. patent application 6,055,436 having docket number PT02836U by Powell et al., entitled Method and Apparatus for Detecting Simulcast Channel Conditions, which is assigned to the assignee of the present invention and hereby incorporated by reference.

Figure 4:
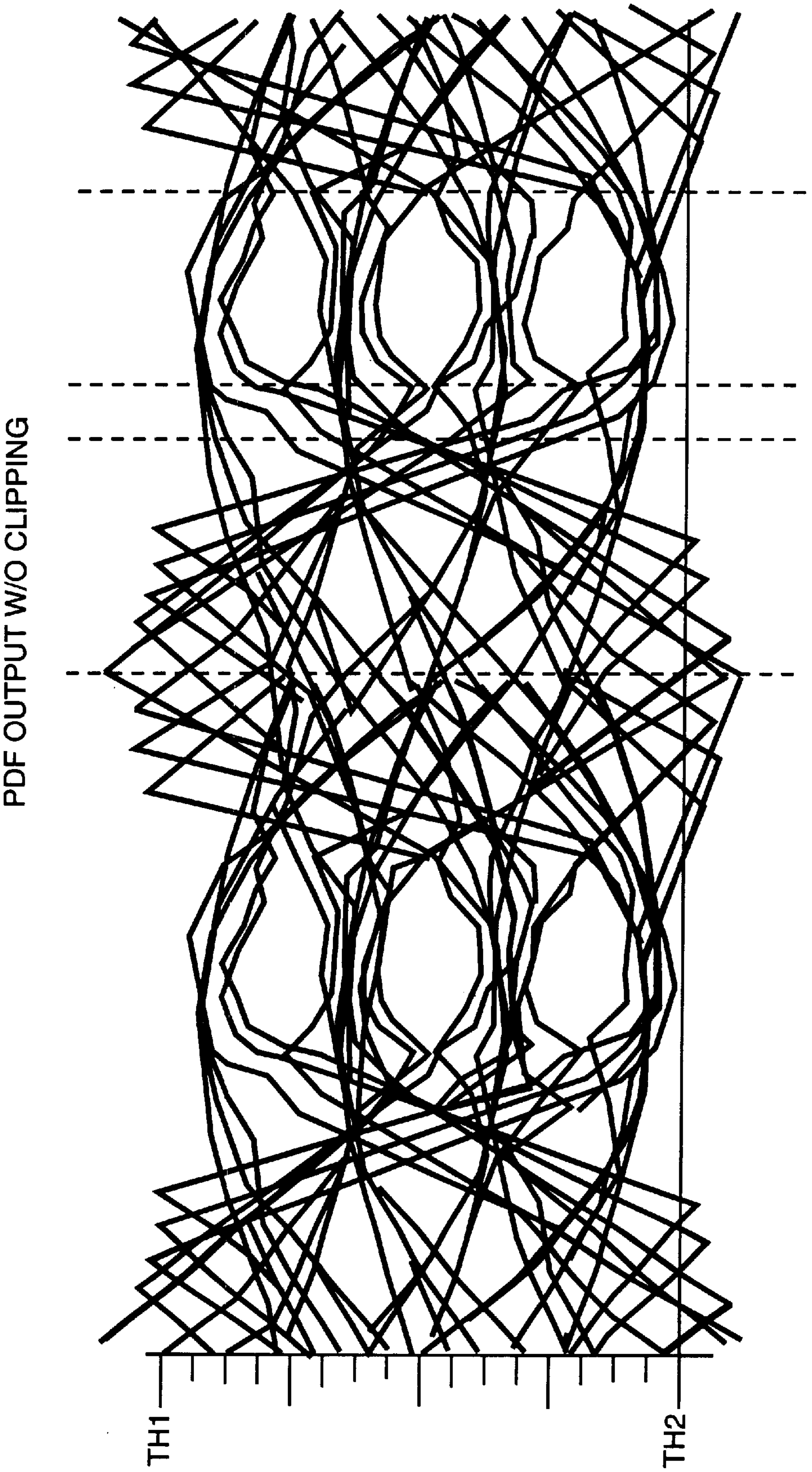
FIG. 4 is an "eye diagram" illustrating an output from a post detection filter in simulcast conditions wherein the detector output was not clipped.
Figure 5:
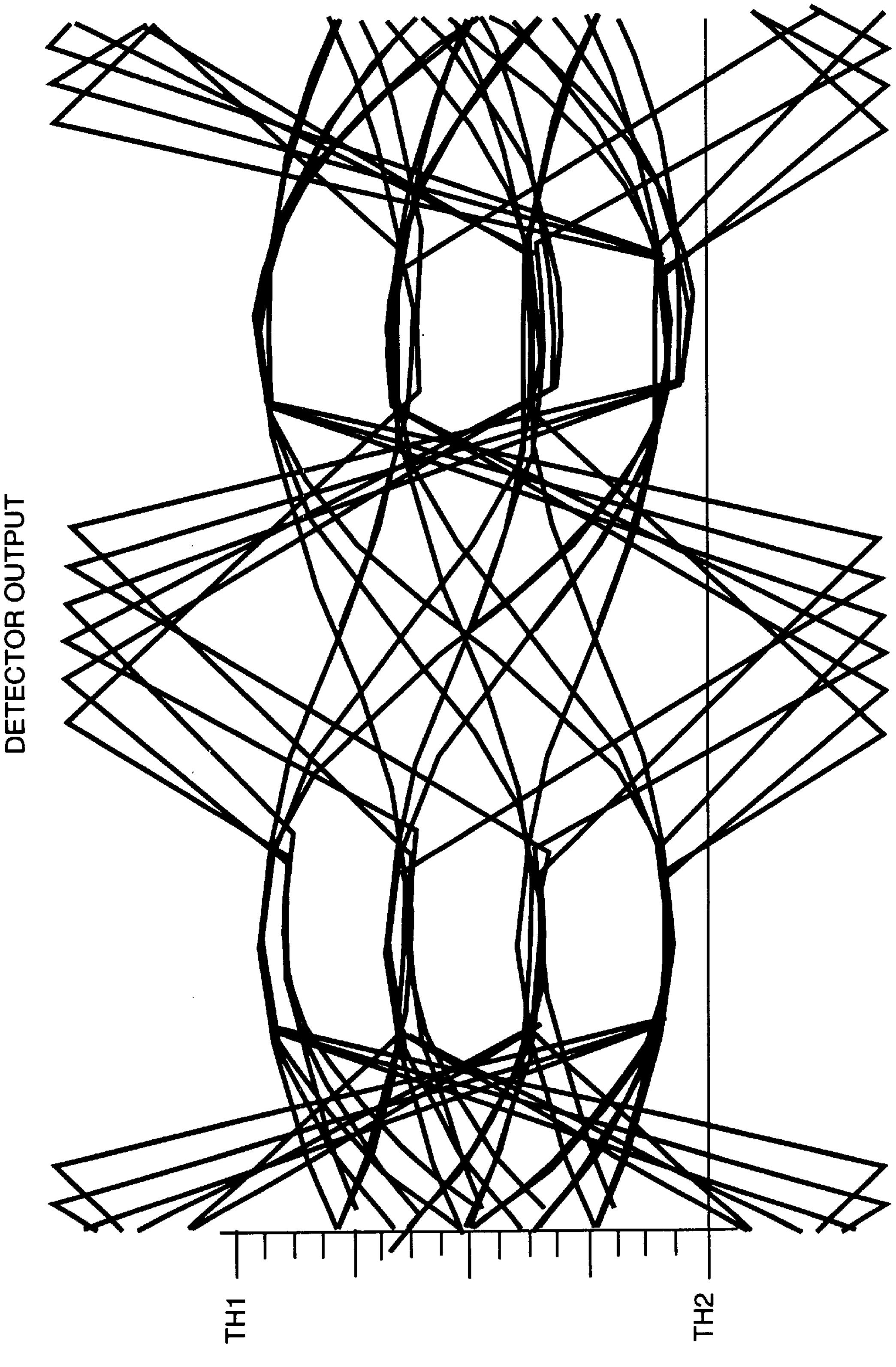
FIG. 5 is an "eye diagram" illustrating a detector output in simulcast conditions.
Figure 6:
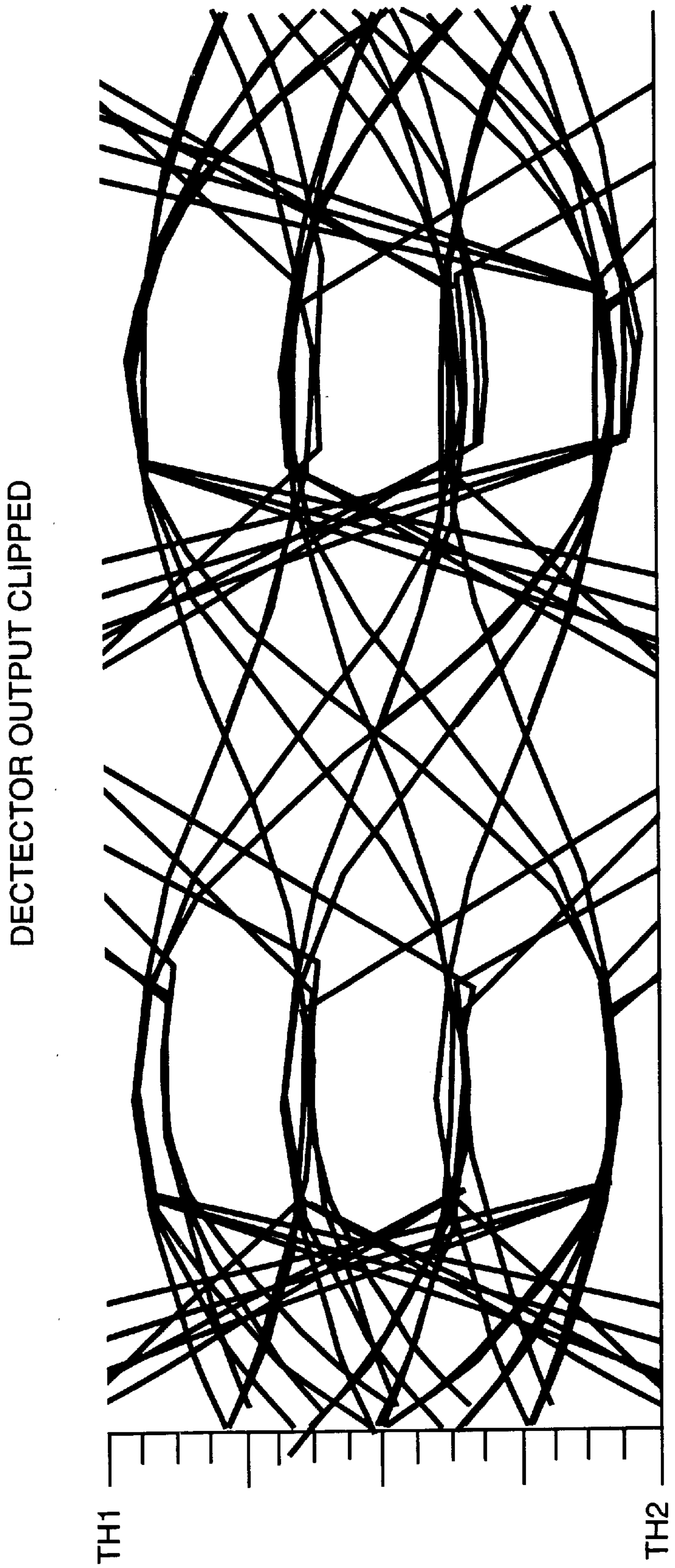
FIG. 6 is an "eye diagram" illustrating a detector output with clipping in simulcast conditions in accordance with the present invention.
Figure 7:
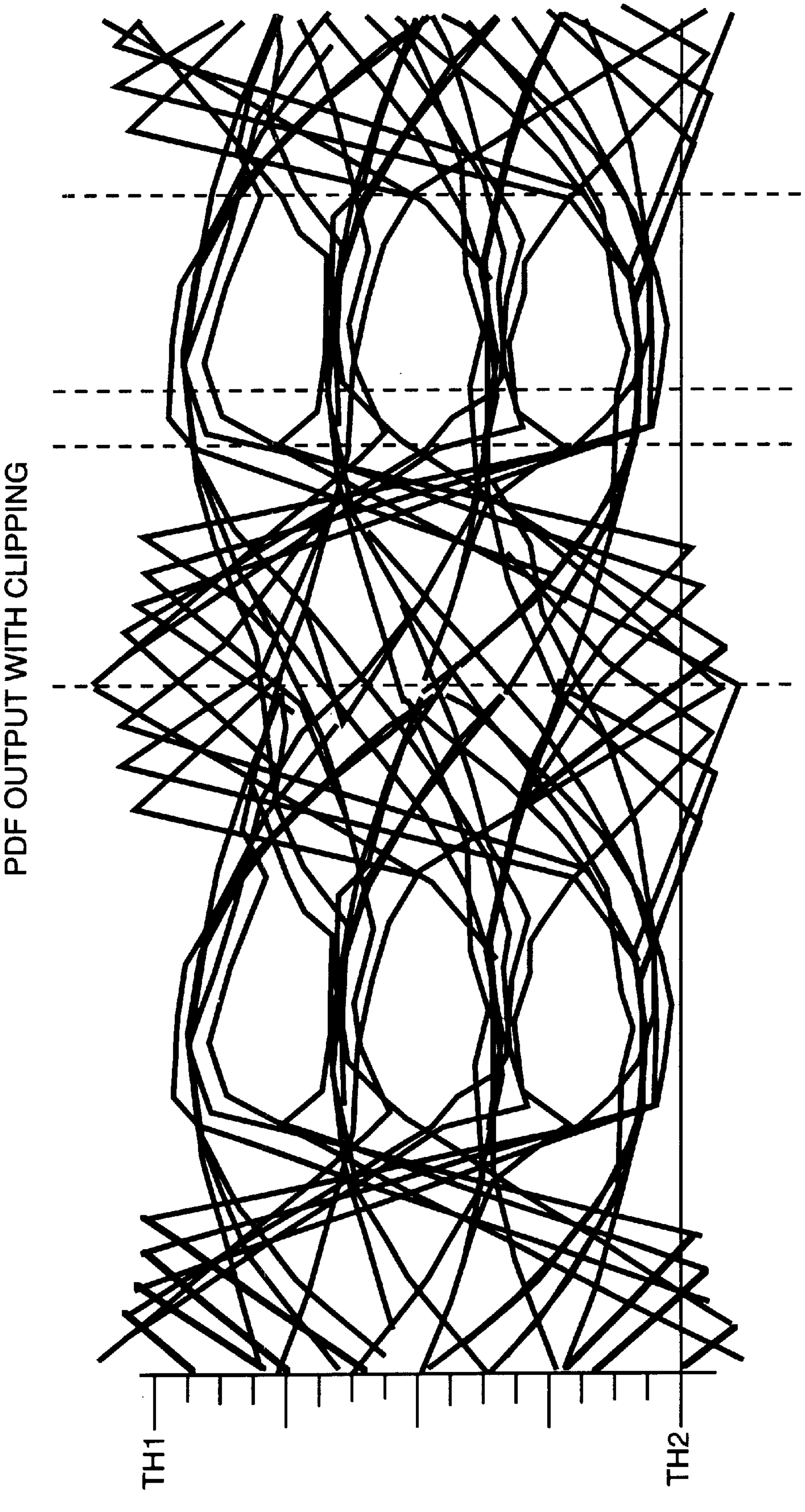
FIG. 7 is an "eye diagram" illustrating an output from a post detection filter in simulcast conditions wherein the detector output was clipped in accordance with the present invention.

Referring to FIGS. 5 and 6, eye diagrams for the detector/demodulator output (input into the post detection filter 40) for simulcast channels illustrate the "eyes" in an eye diagram before and after clipping respectively. Zooming-in on the eye of a simulcast signal with SDS distortion shows that an open eye indeed exists at the output of the detector (PDF input). Applying this signal to the post detection filter (PDF) 40 results in the eye diagram at the PDF output to become further closed as shown in FIG. 4. This closure results from the energy of the transient generated at the symbol transitions (due to the SDS distortion) at the output of the detector being smeared/spread past the symbol transitions towards the center of the symbol as a result of the low pass PDF or integration. Clipping the symbol transitions or symbol edges at the output of the detector 30 reduces the closure effects at the output of the PDF as shown in FIG. 7.

Referring once again to FIG. 1, the simulcast detector 350 preferably requires the use of a synchronization algorithm which has some immunity to the distortion caused by SDS such as those described in docket number PT2636U. The selective call receiver would also preferably require the use of a digital frequency discriminator; such as a frequency demodulator or the DAD demodulator, as demodulator 30.

Figure 2:
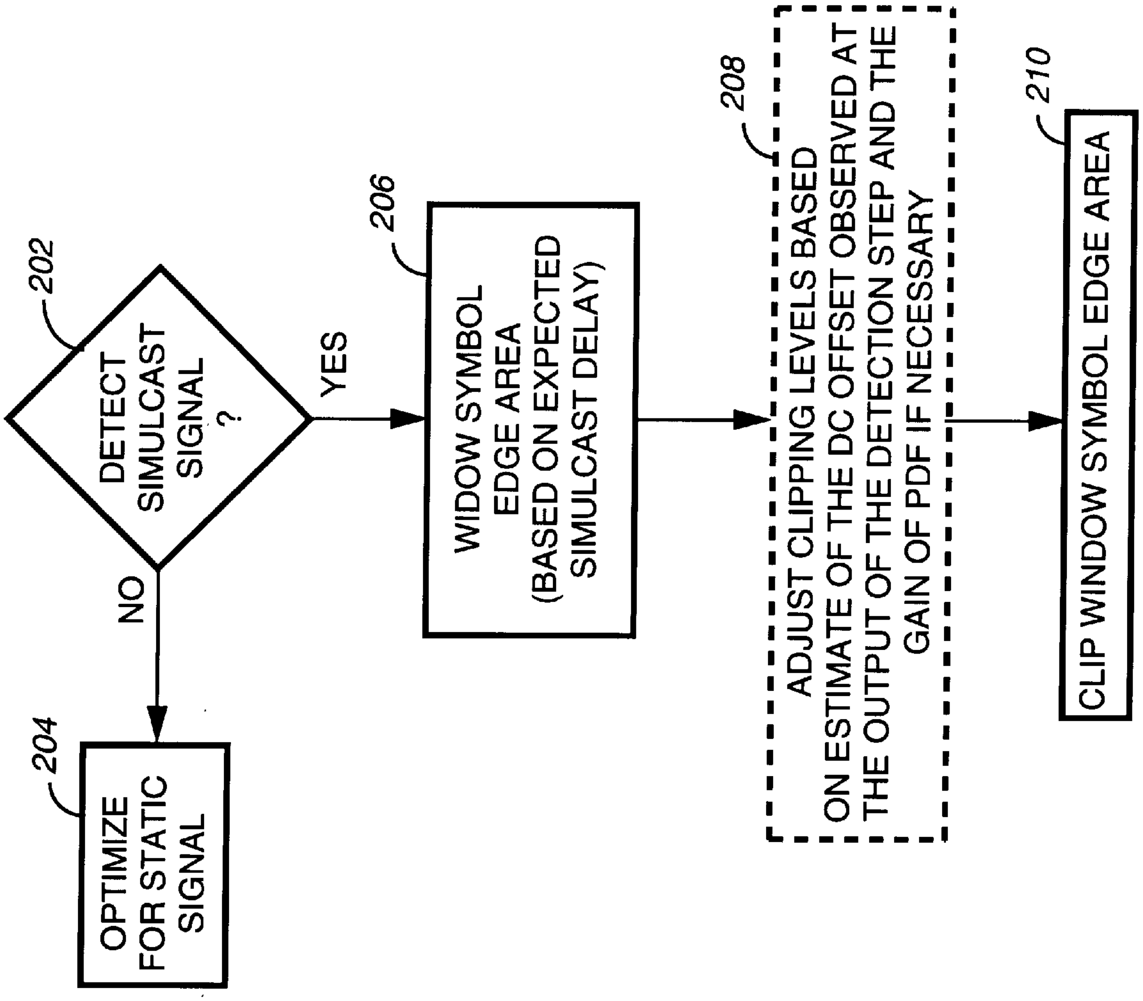
FIG. 2 is a flow chart illustrating a method for reducing data distortion in accordance with the present invention.

Referring to FIG. 2, a flow chart illustrating a method 200 for reducing data distortion received at a selective call receiver within a simulcast system is shown. At decision block 202, a determination is made whether a simulcast signal is detected preferably having a plurality of symbols having corresponding symbol center areas and symbol edge areas. If no simulcast signal is detected at decision block 202, then the selective call receiver is optimized for static signal reception at step 204. If a simulcast signal is detected at decision block 202, then the symbol edge area is windowed at step 206. Then, the windowed symbol edge area is clipped at step 210. Preferably, the step of windowing at step 206 further comprises the step of providing a window width based on the expected simulcast delay up to a predetermined fraction of a symbol time. Further, the step of clipping may further optionally comprise the additional step 208 of adjusting clipping levels based on an estimate of the DC offset observed at the output of the detecting step and the gain of the PDF if necessary.

Figure 3:
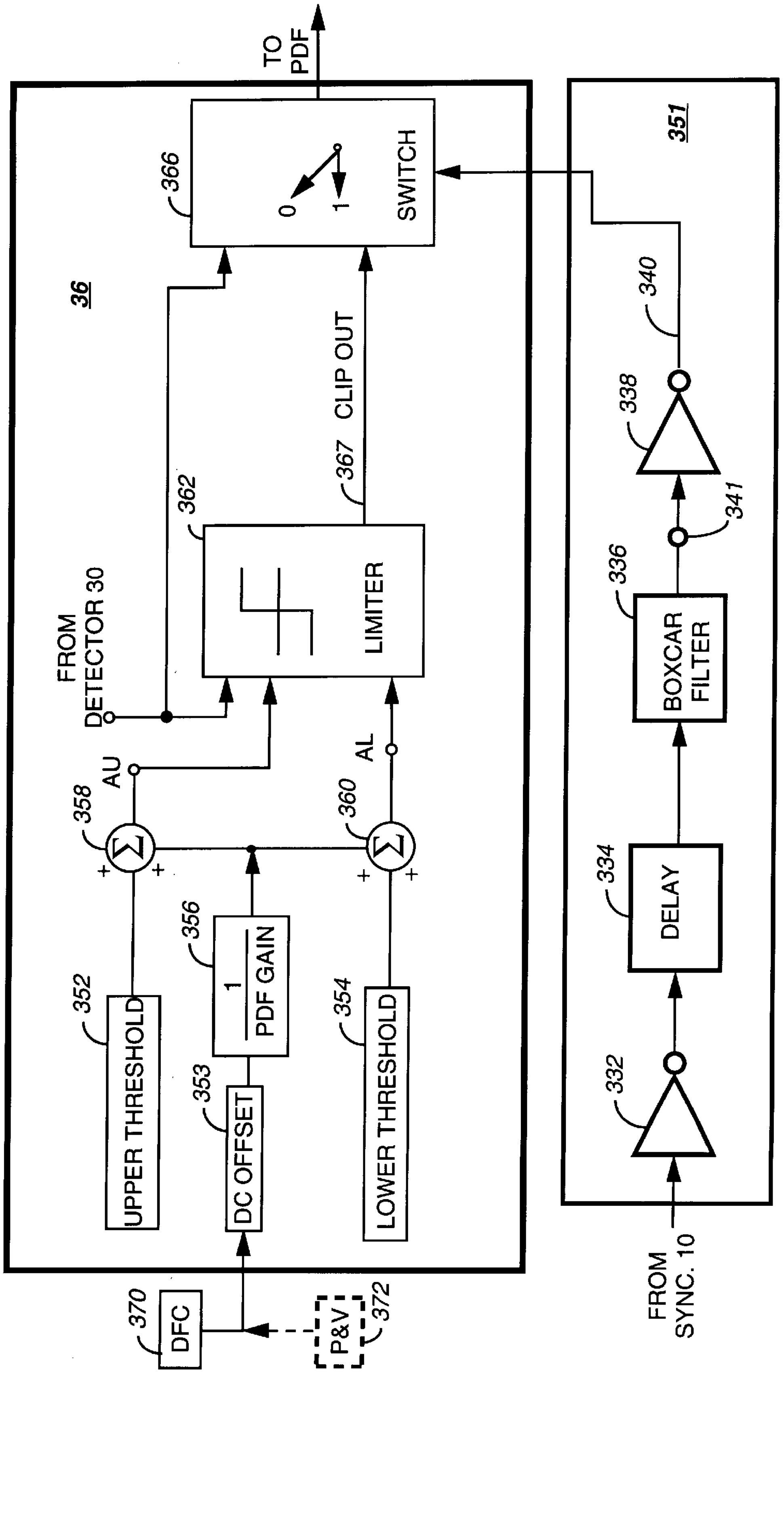
FIG. 3 is a block diagram of a clipping circuit and window generator function in accordance with the present invention.

FIG. 3 shows the detailed block diagram of a clipping function or circuit 36 and a window generator function or circuit 351. The sync inputs 340 and 341 generated by the window generator function 351 are used to generate clocking signals used by clipping circuit 36 to provide the appropriate windows where clipping will occur during the symbol edges. Preferably, the circuit providing the sync input comprises an inverter 332 coupled to a digital delay device 334 coupled to a boxcar filter 336, which in turn is coupled to another inverter 338. The digital delay device 334 compensates for the group delay through the post detection filter so that the sync input provides appropriately aligned windows for the symbol edge (or symbol center if needed).

The clipping function or circuit 36 preferably comprises an upper threshold value 352 and a lower threshold value 354 that is compared with the signal coming from detector 30. Preferably, the upper and lower threshold values are adjusted for a DC offset 353 whose value is compensated by the gain of the Post Detection Filter 40 (see FIG. 1). It should be understood that in the case where the PDF gain is unity, no gain compnesation of the offset 353 is required. Contrastly, if the PDF gain is not unity, the gain compensation of the offset 353 is scaled accordingly. It should also be understood that the thresholds can be adjusted/optimized for best performance. The value of the DC offset estimation (using a Digital Frequency Correction 370 (DFC) circuit or alternatively a Peak and Valley Counter 372) can be used to compensate for the estimated DC offset value. In other words, the estimated value of the DC offset that is compensated by the PDF gain (and used to adjust upper and lower thresholds) can be generated by the DFC or the Peak and Valley counter. These adjustments are summed with the upper and lower threshold values at devices 358 and 360 respectively to provide adjusted upper and lower threshold values (AU and AL respectively). The adjusted upper threshold value, the adjusted lower threshold value, along with the signal from the detector 30 are provided to a comparator/limiter 362 which compares the adjusted upper threshold value with the signal from the detector and clips or limits the signal above the adjusted upper threshold value and further compares the adjusted lower threshold value with the signal from the detector and clips or limits the signal below the adjusted lower threshold value. The output from the comparator limiter 362 provides a clipped signal 367 that provides the PDF input signal during the appropriate windowed period. Element 366 serves as a switch taking the signal 340 from window circuit 351 and switching from the detector signal to the clipped signal 367 during the symbol edge or transition periods.

Referring to FIG. 4, this "eye diagram" illustrates an output from a post detection filter in simulcast conditions wherein the detector output was not clipped. This closure results from the energy of the transient generated at the symbol transitions (due to the SDS distortion) at the output of the detector being smeared/spread past the symbol transitions towards the center of the symbol as a result of the low pass PDF or integration. FIG. 5 illustrates an "eye diagram" of a detector output in simulcast conditions before the signal is past through the PDF. FIG. 6 illustrates that same "eye diagram" as shown in FIG. 5 but with clipping performed in accordance with the present invention. Thus, when clipping is performed at the symbol transitions or edges, the "eye closure" effect is reduced as shown in FIG. 7 illustrating an output from a post detection filter in simulcast conditions wherein the detector output was clipped in accordance with the present invention.

The above description is intended by way of example only and is not intended to limit the present invention in any way except as set forth in the following claims.

What is claimed is:

1. A method for reducing data distortion received at a selective call receiver within a simulcast system, comprising the steps of:

detecting a simulcast signal having a plurality of symbols each having a corresponding symbol center area and symbol edge area;

windowing at least one of the symbol edge areas or symbol center areas in the simulcast signal correspondingly providing a windowed symbol edge area or a windowed symbol center area; and clipping at least one of the windowed symbol edge area or the windowed symbol center area.

2. The method of claim 1, wherein the step of windowing further comprises the step of providing a window width based on the expected simulcast delay up to a predetermined fraction of a symbol time.

3. The method of claim 1, wherein the step of clipping further comprises adjusting clipping levels based on an estimate of the DC offset observed at the output of the detecting step.

4. The method of claim 1, wherein the step of clipping further comprises the step of clipping both the windowed symbol edge area and the windowed symbol center area.

5. A method for reducing data distortion received at a selective call receiver within a simulcast system, comprising the steps of:

detecting a simulcast signal having a plurality of symbols each having a corresponding symbol center area and symbol edge area;

windowing the simulcast signal a fraction of a symbol time providing a windowed symbol area; and clipping the windowed symbol area.

6. The method of claim 5, wherein the steps of windowing and clipping occur during a symbol edge area.

7. The method of claim 5, wherein the steps of windowing and clipping occur during both a symbol center area and a symbol edge area.

8. A method for reducing data distortion received at a selective call receiver within a simulcast system, comprising the steps of:

detecting a simulcast signal having a plurality of symbols having corresponding symbol center areas and symbol edge areas;

windowing the symbol edge area in the simulcast signal providing a windowed symbol edge area; and clipping the windowed symbol edge area.

9. The method of claim 8, wherein the step of windowing further comprises the step of providing a window width based on the expected simulcast delay up to a predetermined fraction of a symbol time.

10. The method of claim 8, wherein the step of clipping further comprises adjusting clipping levels based on an estimate of the DC offset observed at the output of the detecting step.

11. A circuit for reducing data distortion received at a selective call receiver within a simulcast system, comprising:

a detector for detecting a simulcast signal having a plurality of symbols having corresponding symbol center areas and symbol edge areas;

a filter for windowing the symbol edge area in the simulcast signal providing a windowed symbol edge area; and a clipping circuit for clipping the windowed symbol edge area.

12. The circuit of claim 11, wherein the circuit further comprises a post detection filter coupled after the clipping circuit.

13. The circuit of claim 12, wherein the post detection filter is a finite impulse response detector filter.

14. The circuit of claim 12, wherein the circuit further comprises a symbol slicer.

15. The circuit of claim 14, wherein the circuit further comprises a synchronizer.

16. The circuit of claim 11, wherein the detector is a digitally adjustable detector (DAD).

17. A selective call receiver unit capable of detecting a simulcast channel transmission, comprising a selective call receiver;

a demodulator coupled to the selective call receiver; and a circuit coupled to the demodulator for reducing data distortion received at a selective call receiver within a simulcast system, comprising:

a detector for detecting a simulcast signal having a plurality of symbols having corresponding symbol center areas and symbol edge areas;

a filter for windowing the symbol edge area in the simulcast signal providing a windowed symbol edge area; and a clipping circuit for clipping the windowed symbol edge area.

18. The circuit of claim 17, wherein the circuit further comprises a post detection filter coupled after the clipping circuit.

19. The circuit of claim 18, wherein the post detection filter is a finite impulse response detector filter.

20. The circuit of claim 18, wherein the circuit further comprises a symbol slicer.

21. The circuit of claim 18, wherein the circuit further comprises a synchronizer.

22. The circuit of claim 17, wherein the detector is a digitally adjustable detector (DAD).

* * * * *